(12) United States Patent
Harvey et al.

(10) Patent No.: US 10,545,176 B2
(45) Date of Patent: Jan. 28, 2020

(54) CURRENT MEASUREMENT CIRCUIT

(71) Applicant: TRW Limited, Solihull, West Midlands (GB)

(72) Inventors: Stephen Harvey, Worcester (GB); Andrew Williams, Solihull (GB); Philip Browne, Bromsgrove (GB)

(73) Assignee: TRW Limited, Solihull, West Midlands (GB)

( * ) Notice: Subject to any disclaimer, the term of this patent is extended or adjusted under 35 U.S.C. 154(b) by 346 days.

(21) Appl. No.: 15/518,054

(22) PCT Filed: Oct. 8, 2015

(86) PCT No.: PCT/GB2015/052949
§ 371 (c)(1),
(2) Date: Apr. 10, 2017

(87) PCT Pub. No.: WO2016/055796
PCT Pub. Date: Apr. 14, 2016

(65) Prior Publication Data
US 2017/0307660 A1 Oct. 26, 2017

(30) Foreign Application Priority Data
Oct. 10, 2014 (GB) .................................. 1417993.1

(51) Int. Cl.
*G01R 15/14* (2006.01)
(52) U.S. Cl.
CPC .................. *G01R 15/146* (2013.01)
(58) Field of Classification Search
CPC ... G01R 1/203; G01R 15/146; G01R 19/0007
See application file for complete search history.

(56) References Cited

U.S. PATENT DOCUMENTS 6,181,234 B1 1/2001 Szwarc et al.
2013/0057275 A1* 3/2013 Tamura ................. B60L 3/0038
324/252

(Continued)

FOREIGN PATENT DOCUMENTS

DE   101013005939 A1   10/2014
JP      2009098079 A    5/2009

OTHER PUBLICATIONS

PCT/GB2015/052949 ISR and Written Opinion, dated Feb. 29, 2016.

(Continued)

*Primary Examiner* — Tung X Nguyen
(74) *Attorney, Agent, or Firm* — MacMillan, Sobanski & Todd, LLC

(57) ABSTRACT

A current measurement circuit suitable for measuring the flow of current along a path in an electrical circuit such as a part of an electric power assisted steering system comprises a current measurement resistor that is located in series in the electrical path through which a current to be measured may flow, a first measurement sub-circuit that measures the voltage dropped across at least a part of the resistor and produces a first output signal, and a second measurement sub-circuit that measures the voltage dropped across at least a part of the resistor and produces a second output signal, and in which the electrical connections of the two sub-circuits to the resistor are independent of each other.

15 Claims, 3 Drawing Sheets

(56) References Cited

U.S. PATENT DOCUMENTS

2014/0191772 A1* 7/2014 Hetzler .................. G01R 1/203
324/705
2016/0041206 A1 2/2016 Hetzler

OTHER PUBLICATIONS

Great Britain Search Report of GB1417993.1, dated Apr. 13, 2015.
Chinese Notification of First Office Action, Application No. 201580063690.8 dated Feb. 22, 2019.

* cited by examiner

CURRENT MEASUREMENT CIRCUIT

CROSS-REFERENCE TO RELATED APPLICATIONS

This application is the National Phase of International Application PCT/GB2015/052949 filed Oct. 8, 2015 which designated the U.S. and that International Application was published in English under PCT Article 21(2) on Apr. 14, 2016 as International Publication Number WO 2016/055796 A1. PCT/GB2015/052949 claims priority to Great Britain Application No. 1417993.1, filed Oct. 10, 2014. Thus, the subject nonprovisional application claims priority to GB1417993.1, filed. Oct. 10, 2014. The disclosures of both applications are incorporated herein by reference.

BACKGROUND OF THE INVENTION

This invention relates to improvements in current measurement circuits and to an improved current sense resistor for use in such circuits. It is especially related to current measurement in electric power assisted steering systems.

It is well known that the current flowing along a path in an electrical circuit can be measured by measuring the potential drop across a resistor connected in series within the path. Through the application of Ohm's Law the current is given as $I=(V_i-V_o)/R$ where $V_i$ and $V_o$ are the input and output voltages to the resistor in Volts and R is the resistance in Ohms.

The measurement of potential drop is typically made by connecting the input and output side of the resistor to the positive and negative input terminals of a differential amplifier and then to a microprocessor which converts the output of the differential amplifier into a current value if required.

Whilst such circuits are generally reliable, the applicant has appreciated for the first time that there exist a number of possible failure modes and an object of the invention is ameliorate at least one possible mode of failure.

SUMMARY OF THE INVENTION

In accordance with a first aspect the invention provides a current measurement circuit suitable for measuring the flow of current along a path in an electrical circuit such as a part of an electric power assisted steering system, the current measurement circuit comprising:

a current measurement resistor that is located in series in the electrical path through which a current to be measured may flow, a first measurement sub-circuit that measures the voltage dropped across at least a part of the resistor and produces a first output signal, and a second measurement sub-circuit that measures the voltage dropped across at least a part of the resistor and produces a second output signal, and in which the electrical connections of the two sub-circuits to the resistor are independent of each other.

In a most preferred arrangement, as well as the electrical connections being independent of each other the two sub-circuits may also be fully independent, by which we may mean that they have no shared electrical components.

The two sub-circuits may measure the voltage drop across substantially the same path through the resistor. For instance where the resistor has two opposing sides with the path defined therebetween, each sub-circuit may measure the difference in voltage between the two sides of the resistor.

Each sub-circuit may include an amplifier circuit. The amplifier circuit of one sub-circuit may be independent of the amplifier circuit of the other sub-circuit.

The current measurement circuit may include a controller that in use processes the output of the two sub-circuits to provide a single current measurement as an output.

The controller may, in use, set the single current measurement to be equal to the first output signal unless a fault is detected, or equal to the output of the second output signal unless a fault is detected.

When a fault is detected the controller may switch the single current measurement to be equal to the other of the first and second output signals.

The current measurement circuit may therefore include a fault detection circuit that monitors the first and second output signals to detect a fault.

The fault detection circuit may include a comparison means that compares the two output signals and in the event that they deviate in a manner that is inconsistent with an expected deviation a signal indicative of the presence of a fault is generated.

The fault detection means may also be arranged to perform diagnostic tests on each sub-circuit in which an offset voltage is applied to one, or both, inputs of the amplifiers to determine if there is a fault in the amplifier, or in the circuit connecting the amplifier to the current sense resistor, or a fault in the resistor itself.

The first and second current measurement circuits may measure the voltage dropped across different parts of the sense resistor element and from this measurement produce the respective output signals.

It is known that the current flowing through a resistor will create a voltage drop across the resistor, the relationship between the voltage, current and resistance being determined by Kirchoffs Law a:

$$Vdrops=I*R$$

Where Vdrop1,2 is the output signal;

I is the current; and

R is the resistance of the path across the resistor.

Each subcircuit may be arranged to produce a respective output signal by providing the circuit with the resistance value of the part of the current sense resistor that it is connected across. This may be provided in a memory of the circuit and may be set during a calibration of the system.

The current measurement circuit may include a circuit board which is provided with electrical tracks to which the current sense resistor is attached, the board carrying the first and second measurement sub-circuits, each sub-circuit being connected to the sense resistor using electrical connections that are not shared with the other sub-circuit.

The electrical connections of each sub-circuit to the resistor may comprise soldered joints. Each sub-circuit may have its own solder joint that is not shared with the other circuit (each soldered joint being considered to be a single electrical connection within the context of this application).

The sense resistor may include legs or pins that are connected to the associated sub-circuits by the soldered joints. The pins may be an integral part of the sense resistor.

Each of the measurement circuits may be connected to a pair of leg of the resistor that are not shared with the other measurement circuit. Thus, if there is a fault in a leg it will only cause a corresponding fault for one measurement circuit and not the other.

The input to the resistor and the output of the resistor that connect it to the current path along with the current is to be measured may also comprise legs which are not shared with the legs that the current measurement circuits are connected to. The input may comprise two legs, and also the output may comprise two legs, so that there are two solder connections (one per leg) on the input and two solder connections on the output (one per leg). This ensures that there is no single point of failure if one electrical solder joint or leg fails.

The location of the legs on the resistor determines the path across which the voltage drop is measured.

The legs may pass through openings in the circuit board where they are soldered in position, or may rest on the surface of the circuit board (through mounted or surface mounted).

The sense resistor may comprise an electrically conductive, for example metal or metal alloy, element that is folded into a U-shape to define two wings joined at a ridge, each wing being provided with four legs along an edge opposite the ridge for connection to the sub-circuits, to a first part of the path along which current is to be measured, and to a second part of the path that is on the electrically opposite side of the resistor.

The sense resistor therefore comprises a single, integrally formed, element defining two separate resistive paths across which a voltage drop is measured. Each path may be terminated at its two ends by a leg or pin, which is not shared with the other of the two paths.

The current measurement circuit may be especially suited to use in a fault-critical system, such as an electric power assisted steering system including an electric motor having at least one phase, a control circuit which produces control signals that are converted into voltages to be applied to the at least one phase by a motor drive circuit, in which the current measurement circuit produces an output signal indicative of the current flowing in the motor.

According to a second aspect the invention provides a current sense resistor for use in a current measurement circuit comprising a metal element that is provided with at least eight legs, each leg defining a connection point by with the resistor is connected to the current measurement circuit through an electrically conductive joint, in which the legs are located on the metal element in pairs such an electrical path of known resistance is present between each leg of a pair.

The legs may be positioned such that the electrical paths through the element between each pair are different.

For convenience, the resistance along two of the paths may match. (Question—are there any preferences on the resistances of the two paths).

The current sense resistor may be secured to a circuit board with each leg connected to a track of the circuit board through a respective solder joint.

Each leg may pass through an opening in the circuit board track, or may be soldered to the surface of the track without passing through the track.

The resistor may comprise a metal element that forms a U-shape defining two wings joined at a ridge, each wing being provided with four legs along an edge opposite the ridge for connection to the sub-circuits of a current measurement circuit.

Four legs may be provided along one edge, and four along the other. These may be equally spaced apart along the edge.

Various aspects of this invention will become apparent to those skilled in the art from the following detailed description of the preferred embodiment, when read in light of the accompanying drawings.

DETAILED DESCRIPTION OF THE PREFERRED EMBODIMENTS

Figure 1:
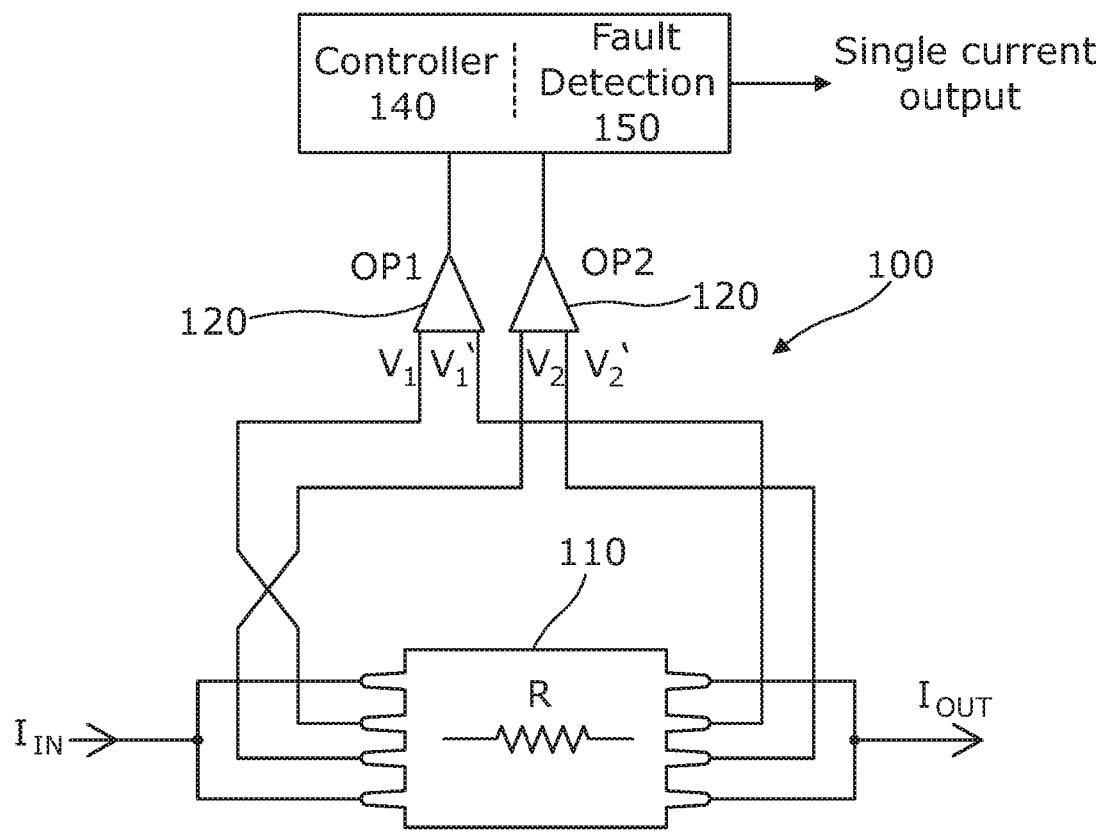
FIG. 1 is a simple block diagram of a current measurement circuit that falls within the scope of the first aspect of the invention.

FIG. 1 shows a current measurement circuit 100 that falls within the scope of the first aspect of the invention. The circuit comprises a current measurement resistor 110 that is located in series in a path along which current is to be measured (Question—have I drawn this correctly?). The current in FIG. 1 enters on the left as $i_{in}$ and exits on the right as $i_{out}$.

Figure 6:
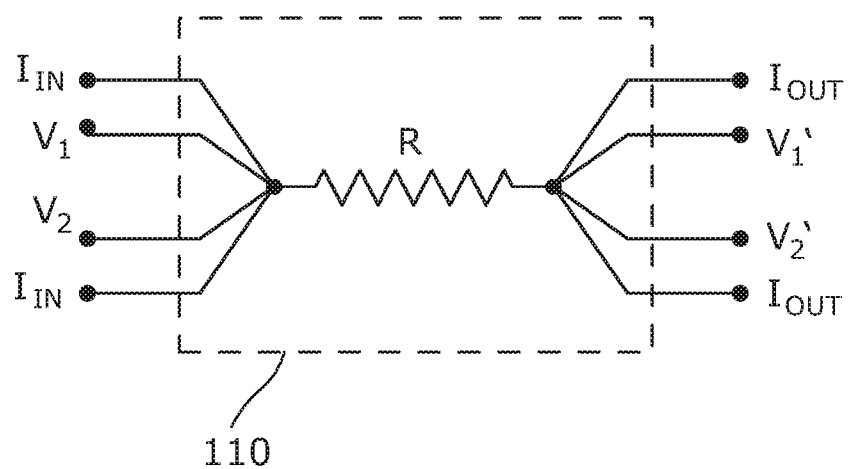
FIG. 6 is an electrical representation of the resistor and the contacts.

The resistor 110, which will be described in more detail later and is represented electrically in FIG. 6, comprises a single element that carries 8 conductive legs, 111-118, the legs forming pairs between which a path of known resistance is present. The path in this example has a resistance R.

The current measurement circuit includes two sub-circuits 120,130, each of which measures the voltage dropped across the resistive path. Typically the sense resistor 110 is provided in the current flow path of the motor purely for this purpose, in series with an active system, and will be of a high tolerance and of known resistance. It is preferred that the resistance along each path between pairs of legs is small so that it has little impact on the overall voltage available for the active circuit, for example of the order of 1 mOhm or less.

Two voltage inputs, $V_{1,1'}$ and $V_{2,2'}$ are taken from each side of the resistor R. Each of the voltages $V_{1,1'}$, $V_{2,2'}$ is fed to a respective input of each sub circuit. As shown each sub circuit 120,130 comprises a differential amplifier formed from an Op-amp. The output of one sub-circuit, Isense1 will be proportional to the current, and the output of the other sub-circuit, Isense2, will also be proportional to the current. The resistor comprises a single resistive element with two pairs of sense connections.

The two signals are fed into a controller 140 that includes a fault diagnostic circuit 150. The controller monitors the two signals, and unless a fault is flagged by the fault diagnostic circuit it uses ISENSE_1 as the primary output of the current measurement circuit.

The diagnostic circuit may apply a diagnostic test to each of the sub-circuits to determine if one or both are faulty. For instance, an offset voltage may be applied to one or both inputs to the differential amplifier (where used) of each sub-circuit, and the behaviour of the output of the amplifiers observed to determine if there is a fault.

If the offset test indicates a problem with ISENSE_1, then the system will transfer to ISENSE_2 for the output of the current measurement circuit. ISENSE_2 is also equipped with the same offset test as ISENSE_1, and when control has been transferred to ISENSE_2, the offset test will be transferred to ISENSE_2 to monitor the correct operation of this amplifier channel. If the offset test then reveals a problem with the ISENSE_2 amplifier, then the system will transition to a further reversionary mode of operation, described below.

Because ISENSE_1 and ISENSE_2 are derived from different legs of the current sense resistor, there are no single point failure modes that are common to both sub-circuits. This removes the common single point failure modes of the sense connections and associated signal paths of prior art circuits. The two sub-circuit share no common components or common electrical paths, and do not share legs of the resistor or common soldered joints.

Figure 2:
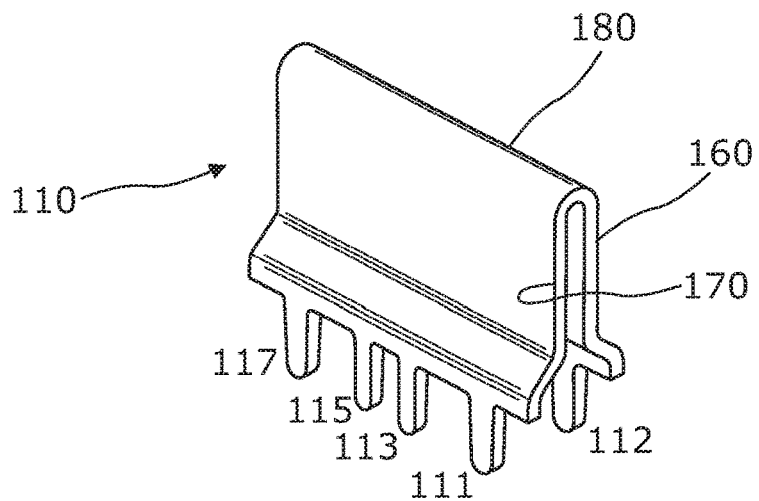
FIG. 2 is a perspective view of a current sense resistor that can be used in the circuit of FIG. 1.
Figure 3:
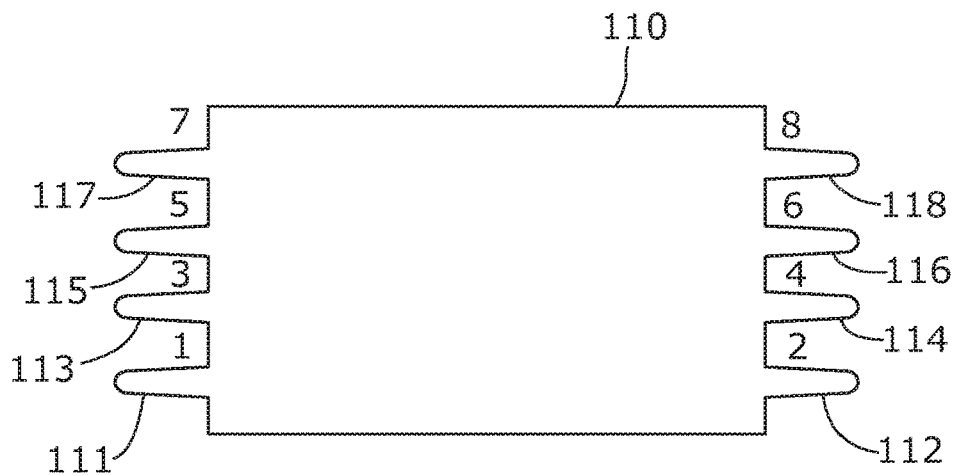
FIG. 3 shows the element flattened out.
Figure 4:
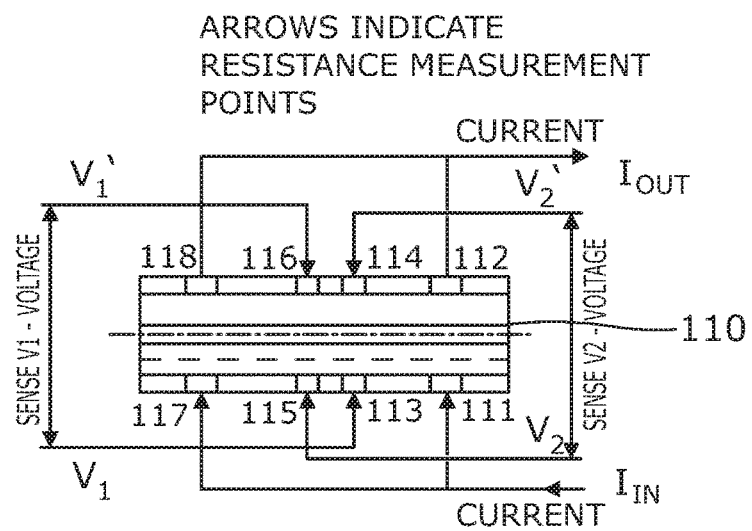
FIG. 4 shows the connections made to each of the eight legs of the current sense resistor.

FIGS. 2 to 4 show a suitable sense resistor element 110 in detail. The element may be formed by bending a flat metal element into U-shape which has two wings 160,170 that meet at a ridge, the free edge of each wing carrying four of the eight legs. FIG. 2 shows the folded resistor, and FIG. 3 shows it flattened before folding. As shown the wings are each planar and lie parallel to one another, extending away from the circuit board at 90 degrees to the board to minimise the amount of real estate used on the circuit board. This shape also helps with cooling as air can flow easily over the resistor 110. Additionally, the low enclosed area of the sense resistor minimises its self-inductance which is beneficial if the measured current signal is rapidly changing.

FIG. 4 shows the location of the electrical connections from the sense resistor element to the two sub-circuits and to the input and output sides of the path along which the current to be measured is flowing. The arrows in FIG. 4 represent the resistance measurement points, a leg being provided at each of these points.

Figure 5:
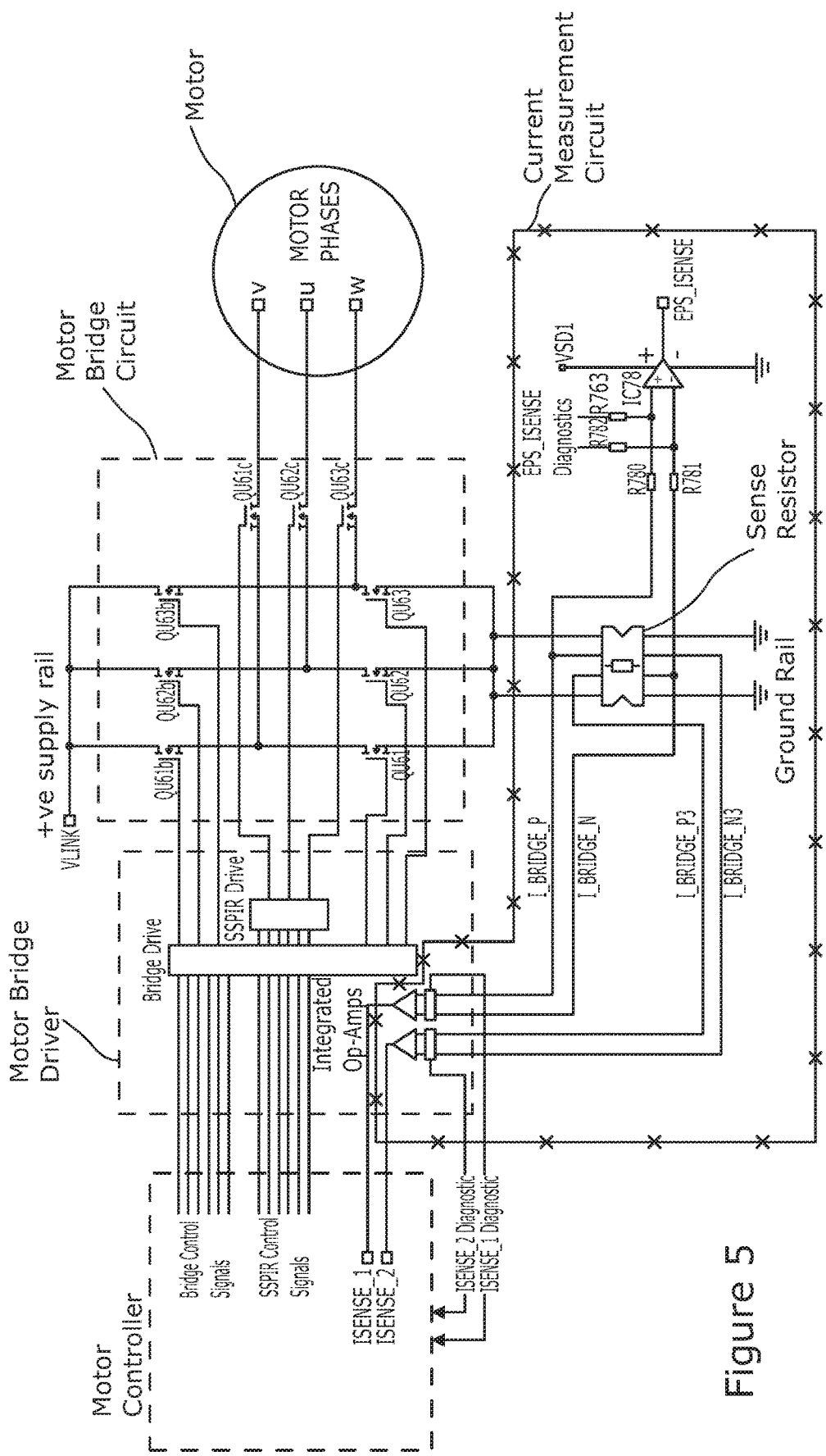
FIG. 5 is a diagram showing a typical application of the current measurement circuit of FIG. 1 in an electric power assisted steering system.

The current measurement circuit is especially suited for use in monitoring the current flowing in a motor of an electrical system such as an electric power steering system. FIG. 5 is a block diagram of one such suitable application.

A motor, which applies an assistance force to a part of a steering system, is driven by a motor bridge circuit that is controlled by a motor bridge driver that receives pulse width modulated signals from a motor controller. The two sub-circuits are integrated with the motor bridge circuit and may as shown share a common circuit board and heat sink (not shown).

The current sense resistor 110 is placed in the path of current flowing in the motor, and the output of the current measurement circuit is fed to the motor controller.

In the event of failure of both current sensing amplifier channels ISENSE_1 and ISENSE_2, detected by the diagnostic circuit of the current measurement circuit, the system motor controller may initially move to a 'voltage control' operating mode that does not depend on measurement of the motor current. However, due to the complete independence of the two sub-circuits which share no common parts, it is expected that such a fault event would be very unlikely to arise.

The principle and mode of operation of this invention have been explained and illustrated in its preferred embodiment. However, it must be understood that this invention may be practiced otherwise than as specifically explained and illustrated without departing from its spirit or scope.

The invention claimed is:

1. A current measurement circuit suitable for measuring the flow of current along an electrical path in an electrical circuit such as a part of an electric power assisted steering system, the current measurement circuit comprising:
    a current sense resistor that is located in series in the electrical path through which a current to be measured flows;
    a first measurement sub-circuit that measures the voltage drop across at least a part of the resistor and produces a first output signal; and
    a second measurement sub-circuit that measures the voltage drop across at least a part of the resistor and produces a second output signal,
    and in which the electrical connections of the two sub-circuits to the current measurement resistor are independent of each other.

2. The current measurement circuit according to claim 1 in which the two sub-circuits are fully independent in that they have no shared electrical components.

3. The current measurement circuit according to claim 1 in which each sub-circuit includes an amplifier circuit and in which the amplifier circuit of one sub-circuit is independent of the amplifier circuit of the other sub-circuit.

4. The current measurement circuit according to claim 1 that includes a controller that, in use, processes the output of the two sub-circuits to provide a single current measurement.

5. The current measurement circuit according to claim 4 in which the controller, in use, sets the single current measurement to be equal to the first output signal unless a fault is detected, and in the event that the fault is detected the controller switches the single current measurement to be equal to the second output signal.

6. The current measurement circuit according to claim 1 that further includes a fault detection circuit that monitors the first and second output signals to detect a fault.

7. The current measurement circuit according to claim 1 in which the first and second measurement sub-circuits measure the voltage drop across different parts of the current sense resistor and from this measurement produce the first and second output signals.

8. The current measurement circuit according to claim 1 that includes a circuit board which is provided with electrical tracks to which the current sense resistor is attached, the board carrying the first and second measurement sub-circuits, each sub-circuit being connected to the current sense resistor using electrical connections that are not shared with the other sub-circuit.

9. The current measurement circuit according to claim 7 in which the electrical connections of each sub-circuit to the current sense resistor comprise soldered joints to legs that are an integral part of the current sense resistor.

10. The current measurement circuit according to claim 9 in which each of the first and second measurement sub-circuits is connected to a pair of legs of the current sense resistor that are not shared with the other measurement sub-circuit.

11. The current measurement circuit according to claim 10 in which the input to the current sense resistor and the output of the current sense resistor that connect it in series into the electrical path along with the current is to be measured comprise legs which are not shared with the legs that the current measurement circuits are connected to.

12. The current measurement circuit according to claim 1 in which the current sense resistor comprises an electrically conductive element that is formed into a U-shape to define two wings joined at a ridge, each wing being provided with four legs along an edge opposite the ridge for connection to the sub-circuits to a first part of the path along which current is to be measured and to a second part of the path that is on the electrically opposite side of the resistor.

13. A current sense resistor for use in a current measurement circuit comprising an electrically conductive element that is provided with at least eight legs, each leg defining a connection point by which the current sense resistor is connected to the current measurement circuit through an electrically conductive joint, in which the legs are located on the electrically conductive element in pairs such that an electrical path of known resistance is present between each leg of a pair.

14. The current sense resistor according to claim 13 in which the legs are positioned such that the electrical paths through the element between each pair are different.

15. The current sense resistor according to claim 13 that comprises an element that forms a U-shape defining two wings joined at a ridge, each wing being provided with four legs along an edge opposite the ridge for connection to a plurality of sub-circuits of the current measurement circuit.

* * * * *